(12) United States Patent
Reber et al.

(10) Patent No.: US 8,900,368 B2
(45) Date of Patent: Dec. 2, 2014

(54) DEVICE AND METHOD FOR CONTINUOUS CHEMICAL VAPOUR DEPOSITION UNDER ATMOSPHERIC PRESSURE AND USE THEREOF

(75) Inventors: Stefan Reber, Gundelfingen (DE); Albert Hurrle, Waldkirch (DE); Norbert Schillinger, Ihringen (DE)

(73) Assignee: Fraunhofer-Gesellschaft zur Förderung der angewandten Forschung E.V., München (DE)

( * ) Notice: Subject to any disclaimer, the term of this patent is extended or adjusted under 35 U.S.C. 154(b) by 1555 days.

(21) Appl. No.: 12/067,233

(22) PCT Filed: Sep. 22, 2006

(86) PCT No.: PCT/EP2006/009228
§ 371 (c)(1),
(2), (4) Date: Jul. 15, 2008

(87) PCT Pub. No.: WO2007/033832
PCT Pub. Date: Mar. 29, 2007

(65) Prior Publication Data
US 2008/0317956 A1 Dec. 25, 2008

(30) Foreign Application Priority Data
Sep. 23, 2005 (DE) .......... 10 2005 045 582

(51) Int. Cl.
| | | |
|---|---|---|
| *C23C 16/455* | (2006.01) | |
| *C23C 16/458* | (2006.01) | |
| *C23C 16/54* | (2006.01) | |
| *C23C 16/44* | (2006.01) | |

(52) U.S. Cl.
CPC ....... *C23C 16/4401* (2013.01); *C23C 16/45502* (2013.01); *C23C 16/4583* (2013.01); *C23C 16/545* (2013.01); *C23C 16/45563* (2013.01); *C23C 16/4412* (2013.01); *C23C 16/455* (2013.01); *C23C 16/54* (2013.01)
USPC ............ 118/733; 118/715; 118/718; 118/719

(58) Field of Classification Search
CPC .... C23C 16/54; C23C 16/545; C23C 16/455; C23C 16/45502; C23C 16/45563; C23C 16/4583; C23C 16/4401
USPC ............. 118/715, 718, 719, 733; 156/345.33, 156/345.31
See application file for complete search history.

(56) References Cited

U.S. PATENT DOCUMENTS

| | | | |
|---|---|---|---|
| 3,367,304 A | | 2/1968 | Williams |
| 3,790,404 A | * | 2/1974 | Garnache et al. ........ 427/255.23 |

(Continued)

FOREIGN PATENT DOCUMENTS

| | | |
|---|---|---|
| EP | 0378815 A2 | 7/1990 |
| EP | 0545542 A1 | 6/1993 |

(Continued)

OTHER PUBLICATIONS

International Preliminary Report on Patentability and Written Opinion for PCT/EP2006/009228, Apr. 24, 2008.

(Continued)

*Primary Examiner* — Jeffrie R Lund
(74) *Attorney, Agent, or Firm* — Matthew B. Dernier, Esq.; Gibson & Dernier LLP (57) ABSTRACT

The invention relates to a device and a method for continuous chemical vapor deposition under atmospheric pressure on substrates. The device is hereby based on a reaction chamber, along the open sides of which the substrates are guided, as a result of which the corresponding coatings can be effected on the side of the substrates which is orientated towards the chamber interior.

12 Claims, 6 Drawing Sheets

(56) References Cited

U.S. PATENT DOCUMENTS

| | | | |
|---|---|---|---|
| 4,048,955 A | | 9/1977 | Anderson |
| 4,495,024 A | * | 1/1985 | Bok .............................. 216/57 |
| 4,587,002 A | * | 5/1986 | Bok ........................ 204/298.25 |
| 4,664,951 A | * | 5/1987 | Doehler ..................... 427/248.1 |
| 5,236,509 A | * | 8/1993 | Sioshansi et al. ............. 118/719 |
| 5,364,481 A | | 11/1994 | Sasaki et al. |
| 6,329,304 B1 | * | 12/2001 | Kuznetsov et al. ........... 438/799 |
| 7,294,207 B2 | | 11/2007 | Strauch et al. |
| 2004/0065255 A1 | * | 4/2004 | Yang et al. ................... 118/715 |
| 2005/0074983 A1 | * | 4/2005 | Shinriki et al. ............... 438/785 |
| 2005/0100664 A1 | * | 5/2005 | Chang et al. ................. 427/127 |
| 2008/0317956 A1 | * | 12/2008 | Reber et al. ............. 427/255.28 |

FOREIGN PATENT DOCUMENTS

| | | |
|---|---|---|
| EP | 1394283 A | 3/2004 |
| GB | 1328390 A | 8/1973 |
| JP | 52030794 A | 3/1977 |
| JP | 2263984 A | 10/1990 |
| JP | 6291349 A | 10/1994 |

OTHER PUBLICATIONS

International Search Report for International Application PCT/EP2006/009228, Apr. 10, 2007.

Written Opinion for International Application PCT/EP2006/009228, Jul. 23, 2007.

"Crystalline sillicon think-film solar cells-recent results at Fraunhofer" by Reber S. et al., Solar Energy, Pergamon Press, BD. 77, Nr. 6 (Dec. 2004) Germany.

"High-Throughput Continuous CVD Reactor for Silicon Deposition" by A Hurrle et al. 19th Eurpoean Photovoltaic Solar Energy Conference, 7-11 (Jun. 2005) Paris.

E. Mesic et. al., "Numerical study of AlGaN growth by MOVPE in an AIX200 RF horizontal reactor" Computational Materials Science 31 (2004) 42-56.

Office Action for corresponding JP Application 2008-531617, dated Mar. 13, 2012.

* cited by examiner

DEVICE AND METHOD FOR CONTINUOUS CHEMICAL VAPOUR DEPOSITION UNDER ATMOSPHERIC PRESSURE AND USE THEREOF

BACKGROUND

The invention relates to a device and a method for continuous chemical vapour deposition under atmospheric pressure on substrates. The device is hereby based on a reaction chamber, along the open sides of which the substrates are guided, as a result of which the corresponding coatings can be effected on the side of the substrates which is orientated towards the chamber interior.

The production of thin layers made of gaseous starting materials (so-called precursors) is implemented with a large number of technical realisations. It is common to all methods that a gaseous precursor or a precursor brought into the gas phase is conducted into a reaction chamber, is decomposed there by the coupling in of energy and components of the gas are deposited on the parts to be coated. One of these methods is atmospheric pressure chemical vapour deposition (termed APCVD). It is characterised in that the precursor and the process chamber are almost at atmospheric pressure. An example of APCVD is APCVD epitaxy of silicon layers made of chlorosilanes. In this case the chlorosilane, normally mixed with hydrogen, is degraded in the reaction chamber at temperatures around 1000-1200° C. and silicon is deposited on a crystalline silicon substrate with the same crystal orientation. This process is used inter alia for solar cells which comprise thin, crystalline Si layers. In particular for this application case, silicon deposition reactors are required, which can deposit an approx. 10-20 µm thick Si layer very economically (under 30 €/m$^2$) and at a high throughput (>20 m$^2$/h). The reactors corresponding to the state of the art cannot achieve these requirements because they a) have too little throughput (e.g. ASM Epsilon 3000:1m$^2$/h) and b) use the silicon contained in the precursor only very incompletely (a few percent). A new development concerns the production of a high throughput reactor for chemical vapour deposition/epitaxy of silicon (Hurrle, S. Reber, N. Schillinger, J. Haase, J. G. Reichart, "High Throughput Continuous CVD Reactor for Silicon Deposition", in Proc. 19$^{th}$ European Conference on Photovoltaic Energy Conversion (WIP—Munich, ETA—Florence 2004, p. 459). In addition to the deposition of silicon, also all other layers which can be deposited under atmospheric pressure are in principle thereby producible in this reactor.

The reactor embodies the following principle (see FIG. 1): 2 parallel rows of substrates 1, 1' are moved into a pipe 2 through a gas lock. In the interior of the pipe there is a chamber 3 which is open on the left and on the right. These openings of the chamber are also termed subsequently "deposition zone". One row of substrates respectively is moved past on an open side of the chamber, closes the opening and thereby seals the chamber volume relative to the pipe volume. The precursor is introduced into the chamber from the front (i.e. the side of the inlet gas lock) through a gas inlet 4 and is suctioned-off through a gas outlet 5 in the rear region of the chamber. A special feature of the deposition chamber is that, relative to the volume situated outside the chamber, a small low pressure is maintained. This prevents large quantities of process gas escaping from the chamber. At the above-mentioned temperatures, the precursor (here: SiHCl$_3$/H$_2$) is degraded and silicon is deposited principally on the continuously rearwardly-moving inner sides of the rows of substrates. The process gas mixture is preferably chosen such that the gas is completely depleted at the rear end of the chamber and no further deposition takes place. As a result, a deposition profile (i.e. a profile or a different deposition thickness) is produced naturally, which is however completely compensated for by the movement of the substrates. The substrates leave the unit at the rear end of the pipe again through a gas lock. A further feature of the reactor is that the substrates can be coated continuously at a uniform feed rate, i.e. a cycled operation which is complex to control is not required.

Figure 1:
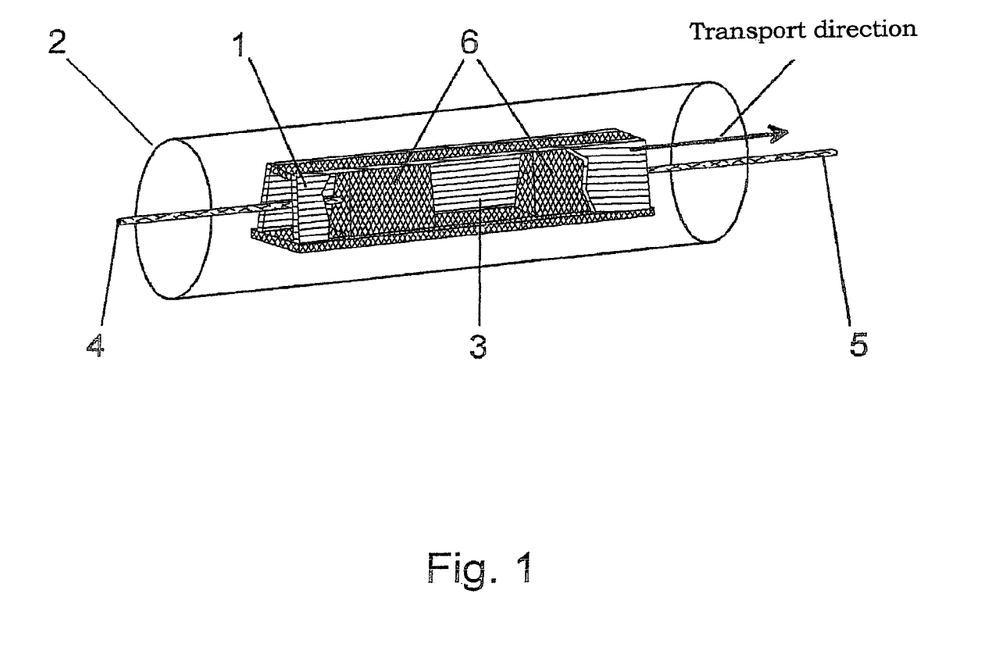
FIG. 1 shows a chemical vapour deposition reactor known from prior art.

At the parts 6 of the chamber which are produced from graphite and also at other surfaces, undesired "parasitic" depositions are produced. These must be removed regularly in order that all the cross-sections are maintained and hence no disturbing flakes are formed. In addition to the chamber surfaces, for example also the gas inlet nozzle or the gas outlet opening is affected by parasitic depositions.

The described principle must scale-up in throughput to a plant suitable for the production of solar cells and also must optimise as far as possible the operating time of the plant, i.e. ensure an interruption-free permanent operation as far as possible. The present invention takes this requirement into account.

SUMMARY OF THE INVENTION

Starting herefrom, it was the object of the present invention to provide a deposition plant for chemical vapour deposition, with which the throughput can be significantly increased relative to the method known from prior art.

According to the invention, a device is provided for continuous chemical vapour deposition under atmospheric pressure on substrates, which has a reaction chamber open on two oppositely situated sides. The substrates to be coated can be transported along the open sides, as a result of which the reaction chamber is sealed. The reaction chamber is thereby constructed such that it has respectively a front- and rear-side wall or another sealing means relative to the transport direction of the substrates, which are connected via two oppositely situated side walls. It is essential for the present invention now that the side walls of the device according to the invention have respectively at least two inlets and outlets for process gases which are disposed alternatingly at least in regions in the transport direction of the substrates. As a result of the alternating arrangement of gas inlets and outlets, the gas flows pass through the device in the counter-flow principle. As a result, the formation of parasitic coatings in the device, i.e. at places which are not intended to be coated, can be minimised or entirely prevented. Interruption of the continuous operation is not required for this purpose, in contrast to the state of the art, as a result of which a significantly higher throughput is achievable.

The concept according to the invention is hereby based on the following approaches:

The number of rows of substrates which are transported in parallel through the device can be increased.

The length of the deposition zone is increased.

In the proceeding deposition operation, the formation of parasitic coatings can be prevented or parasitically coated surfaces can be cleaned during continuous operation.

These approaches can be achieved by the following measures:

By means of skilled arrangement of the gas inlets and gas outlets and also of the associated gas flow.

By means of skilled displacement of the reaction equilibrium present in the gas mixture.

The gas inlets and gas outlets are preferably disposed in the form of nozzles on the side walls.

In this variant, the gas inlet is disposed on a first side wall, whilst the gas outlet is disposed on the oppositely situated side wall. Consequently, the result is formation of a gas flow which extends essentially perpendicular to the transport direction. If these are now disposed alternately, the result is application of the counter-flow principle since the gas flows of the successive gas inlets or gas outlets extend in the opposite direction.

Preferably, the device has at least one gas inlet for the introduction of a precursor for deposition on the substrates. In a further preferred embodiment of the device according to the invention, this likewise has at least one gas inlet for introduction of an etching gas in order to eliminate parasitic depositions.

A second variant of the device according to the invention is based on the fact that the gas inlets and the gas outlets are configured in the form of pipes which extend perpendicular to the transport direction and have a plurality of nozzles which spread out over the length of the pipe. Hence a system is used here with at least one gas inlet pipe and one gas outlet pipe. The individual pipes are thereby disposed preferably in the form of blocks. A preferred variant thereby provides that one block comprises two gas inlet pipes with gas outlet pipes situated therebetween. The device can thereby have in total a large number of blocks of this type which are disposed sequentially in the transport direction. It is likewise possible that an additional gas inlet pipe is also disposed in the block for an etching gas.

As substrates to be coated, preferably silicon, ceramic, glass and/or composites thereof or layer systems are used.

According to the invention, a chemical vapour deposition reactor is also provided, which contains a heating furnace in which at least two devices which are disposed parallel to each other are disposed according to one of the preceding claims. A further chemical vapour deposition reactor likewise contains a heating furnace in which however the devices according to the invention are disposed sequentially.

According to the invention, a method for continuous chemical vapour deposition under atmospheric pressure on substrates is likewise provided, in which the device according to the invention is used. The gas supply is thereby controlled such that, during the deposition on the substrates, parasitic depositions in the device are prevented and/or removed at the same time.

Preferably, at least one precursor is supplied via at least one gas inlet and is deposited then on the substrates during the coating process. Gas is thereby suctioned out of the device via at least one gas outlet. The suctioning-off can thereby be effected preferably via a pump.

A preferred variant of the method according to the invention now provides that, by means of periodic change of the composition of the at least one supplied gas, parasitic depositions in the device can be prevented and/or removed during the deposition process. If parasitic depositions are to be removed, then preferably at least one etching gas is supplied in order to remove these. This is then effected via a gas inlet for at least one etching gas. It is hereby possible both that the etching gas is supplied via a separate gas inlet and that the etching gas and the precursor are supplied via the same gas inlets, which is then effected in a temporal cycle.

In the method according to the invention it is particularly preferred to supply the at least one precursor and the at least one etching gas to the device periodically alternating via different gas inlets. In addition, is it preferred that the at least one etching gas and the at least one precursor are chemically compatible with each other.

Preferably, the gas inlets in the side walls or the nozzles into the gas inlet should be positioned such that they are directed towards the substrates so that a gas flow can be produced in the direction of the substrates. In contrast, the gas inlets or the nozzles of the gas inlet pipes for the at least one etching gas should be directed towards the surfaces of the device with parasitic depositions so that the parasitic depositions on these components of the device can be etched back.

In addition, it is preferred that, in the previously described block-wise construction, different process gases are supplied within the device, so that different layers or layer compositions can be deposited on the substrates during transport of the latter.

The method according to the invention can be implemented according to two different variants. In a first variant, slots are present between the delimitations of the process chamber and the substrates, the dimension of which changes substantially at no time. As a result, both continuous transport of the substrates through the device is made possible (i.e. at no time is there standstill of the substrate) and a cycled transport, comprising a transport cycle and a stationary cycle. Emergence of process gases is prevented by a suitable purge gas control. Alternatively, also sliding seals can be used in order to achieve a seal between substrate and process chamber. However problems can occur with respect to such a seal at high temperature and with high purity requirements.

A second preferred embodiment provides that the width of the slots is changed periodically during the process and the substrates are transported in a pulsed manner through the device. During a deposition cycle, the substrates rest on the delimitations of the process chamber and seal the same in an adequately gas-tight manner. During a short transport cycle, the substrates are raised from the chamber, are further transported and placed down again. The gas emergence from the slots produced during the transport cycle is prevented by suitable purge gas control. This is effected as in the previously described variant in that the pressure in the chamber is lowered relative to the ambient pressure until an adequate purge gas flow is made possible or at least a flow to the exterior is prevented. The advantages of this second variant reside, on the one hand, in a higher tolerance relative to pressure- or flow variations and, on the other hand, in a lower-contamination deposition volume, e.g. with respect to the purge gas and the contamination entrained therewith.

The subject according to the invention is intended to be explained in more detail with reference to the subsequent examples without wishing to restrict the latter to the special embodiments represented here.

DETAILED DESCRIPTION OF THE INVENTION

Example 1

Figure 2:
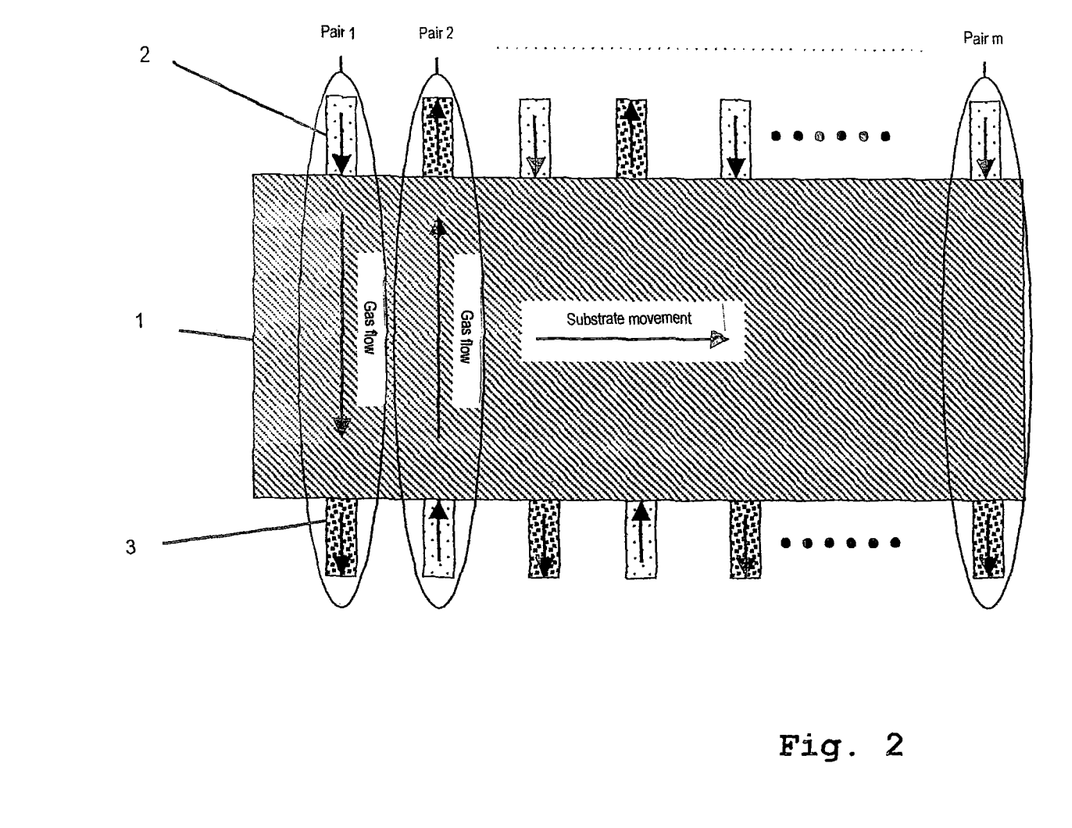
FIG. 2 shows a preferred embodiment of the device according to the invention with gas inlets and gas outlets alternating in the transport direction.

In a first preferred embodiment, the precursor in conveyed through inlet nozzles into the deposition chamber 1, said inlet nozzles being located on the longitudinal sides of the deposition chamber which is not formed by the substrates (see FIG. 2). One gas inlet 2 and gas outlet 3 respectively are situated approximately opposite each other, two successive pairs (e.g. pair 1 and pair 2 from FIG. 2) are disposed in mirror image. The gas flows of the successive pairs then run in counter-flow. According to the invention, the system is operated such that the precursor from the gas inlet to the gas outlet of one pair is used at a high percentage of the theoretically possible value, i.e. a profile is produced in which, because of gas depletion, almost no more deposition takes place at some point. Etching-back of parasitic layers takes place by using chemically compatible etching gas in one or more inlet pairs whilst the remaining pairs are still in the deposition operation. Alternatively, etching back can be achieved by changing the gas composition of the precursor (e.g. raising the Cl/H ratio in the case of chlorosilanes). The gas flow is changed during etching back such that the parasitically coated surfaces are preferably attacked and the layer to be used subsequently is saved as far as possible. At least the parasitically coated surface which is assigned to one pair of nozzles must thereby be etched back effectively. After conclusion of etching back, the pair of nozzles is again supplied with precursor for deposition and etching back begins again on a different pair of nozzles. This process is further continued periodically.

If it is advantageous for the process, the role of gas inlets and outlets can be exchanged periodically.

m pairs respectively form one deposition chamber.

Example 2

Figure 3:
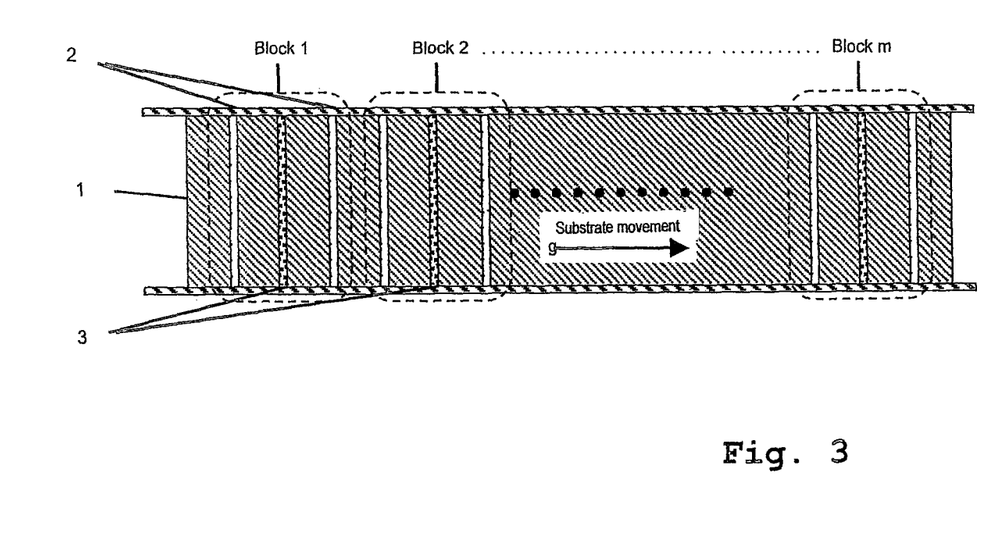
FIG. 3 shows an embodiment of the device according to the invention in which gas inlet pipes and gas outlet pipes which are disposed in blocks are used.
Figure 4:
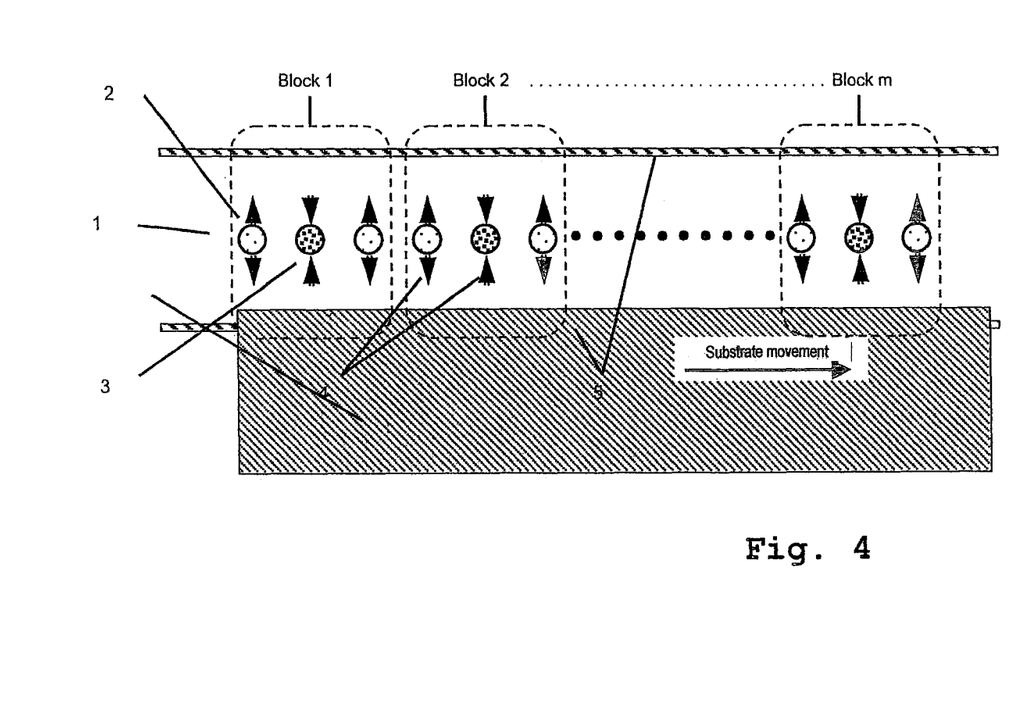
FIG. 4 shows the embodiment variant, which is represented in FIG. 3, in plan view.

A second form of the invention is characterised in the following: instead of an inlet-/or outlet nozzle at the side of the deposition chamber, gas inlet pipes with a plurality of inlet-/outlet nozzles which are distributed on the length of the pipe traverse the deposition chamber perpendicular to the direction of movement. A gas inlet pipe at the front and at the back respectively are assigned to one gas outlet pipe (see FIGS. 3 and 4) The gas is preferably blown out of the gas inlet pipes in the direction of the substrates. In the following, this arrangement is termed "block". During the deposition operation, precursor is introduced into both gas inlet pipes, the consumed gas is suctioned off by the gas outlet pipe therebetween. In the deposition chamber, any number of these blocks are disposed in succession. For etching back, one or more blocks is operated with etching gas which is chosen in its flow such that the parasitically coated surfaces are preferably gassed and hence etched back. Form 2 is extended as follows: instead of 2 gas inlet pipes per etching-back pipe respectively, the block is supplemented by additional gas inlet pipes in front of or behind the gas outlet pipe ("extended block"). Respectively m (extended blocks) form one deposition chamber.

Example 3

Figure 5:
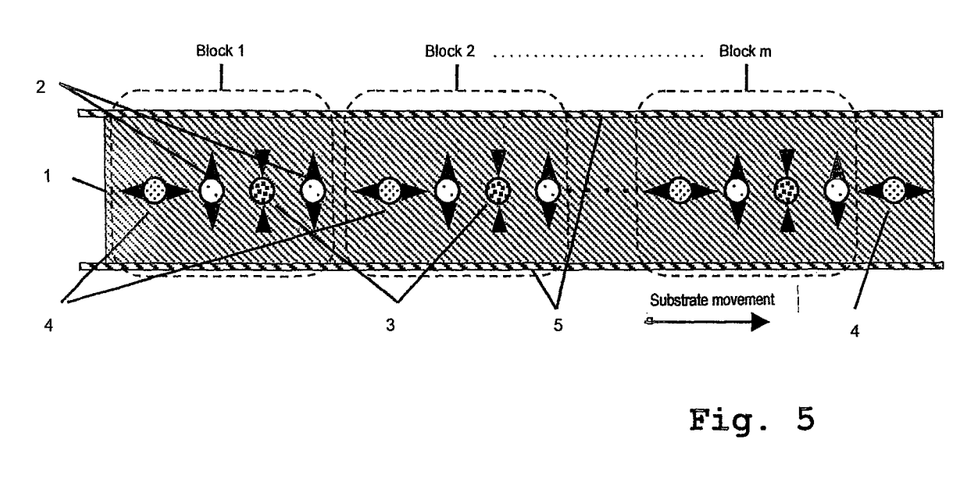
FIG. 5 shows a further embodiment of the device according to the invention with a block-wise arrangement of gas inlet pipes and gas outlet pipes and also additional etching-back pipes.
Figure 6:
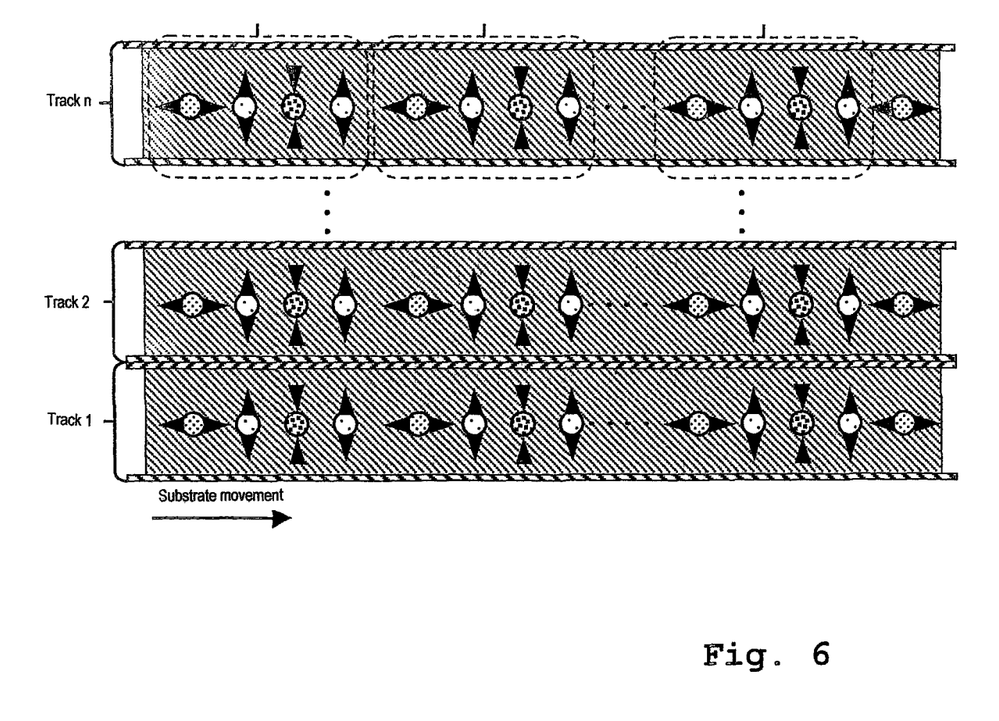
FIG. 6 shows an arrangement according to the invention in which a plurality of devices according to the invention and according to FIG. 5 are disposed parallel to each other.

In a third form, the block of form 2 is supplemented by a preceding, separate etching-back pipe (see FIG. 5). This etching-back pipe can be supplied with etching gas and etch back the respectively adjacent gas inlet- and outlet pipes. The direction of the etching gas flow is chosen such that the locations of the parasitic depositions are etched preferentially. Etching back can take place both in a cycle as in form 1 and 2 (i.e. the supply of precursor to the adjacent gas inlet pipes is interrupted during etching back) and in the proceeding deposition operation of all the gas inlet pipes. An essential feature of this operation is that the gas composition at the location of the gas inlet- and gas outlet pipes is changed by the etching gas such that the reaction equilibrium is displaced from deposition in the direction of etching. By means of direction and the quantity of etching gas, it is most extensively prevented that etching takes place on the substrate itself. Also the blocks of form 3 can be extended by additional gas inlet pipes, as in form 2. Respectively m of the blocks are disposed successively in series for one deposition chamber, an etching-back pipe after the $m^{th}$ block sealing a deposition chamber.

The invention claimed is:

1. A device for continuous chemical vapour deposition under atmospheric pressure on substrates, containing a reaction chamber, the reaction chamber comprising:
    front and rear side walls facing one another in an opposing spaced-apart configuration along a longitudinal axis,
    first and second side walls coupled to the front and rear walls and facing one another in an opposing spaced-apart configuration along a first lateral axis, the first lateral axis being transverse to the longitudinal axis, such that the front, rear, first and second side walls define an interior volume of the reaction chamber,
    first and second openings into the interior volume of the reaction chamber and being oriented in an opposing spaced-apart configuration along a second lateral axis, the second lateral axis being transverse to both the first lateral axis and the longitudinal axis, and
    at least two pair of gas inlets/outlets, including: (i) a first gas inlet disposed through the first side wall, and a first gas outlet disposed through the second side wall, and (ii) a second gas inlet disposed through the second side wall, and a second gas outlet disposed through the first side wall,
    wherein at least first and second substrates to be treated are transported past the reaction chamber in a transport direction parallel to the longitudinal axis, such that the respective substrates temporarily close off the first and second openings, respectively, thereby defining a closed internal volume of the reaction chamber and receiving deposition gas via the at least two pair of gas inlets/outlets.

2. The device according to claim 1, the gas inlets and gas outlets are disposed in the form of nozzles on the side walls.

3. The device according to claim 1, wherein at least one of: (i) the first gas inlet and outlet are oriented substantially opposite to one another in a direction parallel to the first lateral axis, and (ii) the second gas inlet and outlet being oriented substantially opposite to one another in a direction parallel to the first lateral axis, such that formation of a gas flow is achieved which extends essentially perpendicular to the transport direction.

4. The device according to claim 1, wherein at least one of the gas inlets is operable for the introduction of a precursor for deposition on the substrates.

5. The device according to claim 1, wherein at least one of the gas inlets is operable for the introduction of etching gas in order to eliminate parasitic depositions.

6. The device according to claim 1, wherein the gas inlets and gas outlets are configured in the form of pipes which extend perpendicular to the transport direction and have a plurality of nozzles which spread out over a length of the pipe.

7. The device according to claim 6, wherein a plurality of pipes is disposed in the form of blocks.

8. The device according to claim 7, wherein the device has a large number of blocks which are disposed sequentially in the transport direction.

9. The device according to claim 7, wherein at least one of the blocks has an additional gas inlet pipe for an etching gas.

10. The device according to claim 1, wherein the substrates consist of silicon, ceramic, glass and/or composites thereof or layer systems.

11. A chemical vapour deposition reactor, comprising:
a heating furnace; and
at least two devices which are disposed parallel to each other within the heating furnace, each device being for continuous chemical vapour deposition under atmospheric pressure on substrates and contains a reaction chamber, the reaction chamber comprising:
front and rear side walls facing one another in an opposing spaced-apart configuration along a longitudinal axis,
first and second side walls coupled to the front and rear walls and facing one another in an opposing spaced-apart configuration along a first lateral axis, the first lateral axis being transverse to the longitudinal axis, such that the front, rear, first and second side walls define an interior volume of the reaction chamber,
first and second openings into the interior volume of the reaction chamber and being oriented in an opposing spaced-apart configuration along a second lateral axis, the second lateral axis being transverse to both the first lateral axis and the longitudinal axis, and
at least two pair of gas inlets/outlets, including: (i) a first gas inlet disposed through the first side wall, and a first gas outlet disposed through the second side wall, and (ii) a second gas inlet disposed through the second side wall, and a second gas outlet disposed through the first side wall,
wherein at least first and second substrates to be treated are transported past the reaction chamber in a transport direction parallel to the longitudinal axis, such that the respective substrates temporarily close off the first and second openings, respectively, thereby defining a closed internal volume of the reaction chamber and receiving deposition gas via the at least two pair of gas inlets/outlets.

12. A chemical vapour deposition reactor, comprising:
a heating furnace; and
at least two sequentially disposed devices within the heating furnace, each device being for continuous chemical vapour deposition under atmospheric pressure on substrates and contains a reaction chamber, the reaction chamber comprising:
front and rear side walls facing one another in an opposing spaced-apart configuration along a longitudinal axis,
first and second side walls coupled to the front and rear walls and facing one another in an opposing spaced-apart configuration along a first lateral axis, the first lateral axis being transverse to the longitudinal axis, such that the front, rear, first and second side walls define an interior volume of the reaction chamber,
first and second openings into the interior volume of the reaction chamber and being oriented in an opposing spaced-apart configuration along a second lateral axis, the second lateral axis being transverse to both the first lateral axis and the longitudinal axis, and
at least two pair of gas inlets/outlets, including: (i) a first gas inlet disposed through the first side wall, and a first gas outlet disposed through the second side wall, and (ii) a second gas inlet disposed through the second side wall, and a second gas outlet disposed through the first side wall,
wherein at least first and second substrates to be treated are transported past the reaction chamber in a transport direction parallel to the longitudinal axis, such that the respective substrates temporarily close off the first and second openings, respectively, thereby defining a closed internal volume of the reaction chamber and receiving deposition gas via the at least two pair of gas inlets/outlets two oppositely situated sides that are open, such that along the open sides of which substrates can be transported whilst sealing the reaction chamber, front and rear side walls, respectively, relative to the transport direction of the substrates, two oppositely situated side walls operable to connect the front and rear side walls, wherein the side walls have respectively at least two gas inlets and gas outlets for process gases which are disposed alternatingly at least in regions in the transport direction.

* * * * *